United States Patent
Wu (10) Patent No.: US 9,526,168 B2
(45) Date of Patent: Dec. 20, 2016

(54) PRINTED WIRING BOARD AND METHOD FOR MANUFACTURING THE SAME

(71) Applicant: IBIDEN CO., LTD., Ogaki (JP)

(72) Inventor: Youhong Wu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 8 days.

(21) Appl. No.: 14/719,440

(22) Filed: May 22, 2015

(65) Prior Publication Data

US 2015/0342039 A1    Nov. 26, 2015

(30) Foreign Application Priority Data

May 22, 2014   (JP) ................................ 2014-106006

(51) Int. Cl.
| | |
|---|---|
| H05K 1/02 | (2006.01) |
| H05K 1/03 | (2006.01) |
| H01L 23/12 | (2006.01) |
| H05K 3/46 | (2006.01) |
| H05K 3/34 | (2006.01) |

(52) U.S. Cl.
CPC ............... *H05K 1/036* (2013.01); *H01L 23/12* (2013.01); *H05K 1/0298* (2013.01); *H05K 3/4673* (2013.01); *H01L 2924/0002* (2013.01); *H05K 3/3436* (2013.01); *H05K 3/4644* (2013.01); *H05K 2201/0191* (2013.01); *H05K 2201/0195* (2013.01); *H05K 2201/0209* (2013.01); *H05K 2201/0266* (2013.01); *H05K 2203/066* (2013.01); *Y10T 29/49156* (2015.01)

(58) Field of Classification Search
CPC .... H05K 1/036; H05K 1/0298; H05K 3/3436; H05K 3/4644; H05K 2203/066; H05K 2201/0191; H05K 2201/0195; H05K 2201/0209; H05K 2201/0266; H01L 23/12
See application file for complete search history.

(56) References Cited

U.S. PATENT DOCUMENTS

| | | | | | |
|---|---|---|---|---|---|
| 5,055,321 | A | * | 10/1991 | Enomoto | ............. H05K 1/0373 216/18 |
| 5,600,414 | A | * | 2/1997 | Hyllberg | ............. G03G 15/0233 361/225 |

(Continued)

FOREIGN PATENT DOCUMENTS

JP        2014-072371 A       4/2014

*Primary Examiner* — Hoa C Nguyen
(74) *Attorney, Agent, or Firm* — Oblon, McClelland, Maier & Neustadt, L.L.P.

(57) ABSTRACT

A printed wiring board includes an inner conductive-circuit layer, an insulation layer structure including a first insulation layer laminated on inner conductive-circuit layer and a second insulation layer laminated on the first insulation layer, and an outermost conductive-circuit layer laminated on the insulation layer structure and including connection portions such that the connection portions are positioned to mount a component on the insulation layer structure. The second insulation layer is interposed between the first insulation layer and the outermost conductive-circuit layer and has a thickness which is smaller than a thickness of the first insulation layer such that an outer surface of the second insulation layer on an outermost conductive-circuit-layer side is flatter than an inner surface of the second insulation layer on a first insulation-layer side.

20 Claims, 11 Drawing Sheets

(56) References Cited

U.S. PATENT DOCUMENTS

| | | | | |
|---|---|---|---|---|
| 6,365,843 | B1* | 4/2002 | Shirai | H05K 1/113 |
| | | | | 174/255 |
| 6,909,054 | B2* | 6/2005 | Sakamoto | H01L 21/4846 |
| | | | | 174/260 |
| 7,390,974 | B2* | 6/2008 | Shirai | H05K 3/421 |
| | | | | 174/263 |
| 8,745,863 | B2* | 6/2014 | Asai | H05K 3/387 |
| | | | | 29/830 |
| 2005/0088833 | A1* | 4/2005 | Kikuchi | H01L 23/13 |
| | | | | 361/763 |
| 2005/0230835 | A1* | 10/2005 | Sunohara | H01L 23/5389 |
| | | | | 257/758 |
| 2007/0030628 | A1* | 2/2007 | Yamamoto | H01G 4/232 |
| | | | | 361/311 |
| 2007/0125575 | A1* | 6/2007 | Inui | H01L 21/4857 |
| | | | | 174/262 |
| 2007/0297729 | A1* | 12/2007 | Kodama | G02B 6/42 |
| | | | | 385/94 |
| 2011/0088937 | A1* | 4/2011 | Ko | H05K 3/4602 |
| | | | | 174/261 |
| 2012/0073870 | A1* | 3/2012 | Jeon | H01L 21/486 |
| | | | | 174/262 |

\* cited by examiner

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2014-106006, filed May 22, 2014, the entire contents of which are incorporated herein by reference.

BACKGROUND OF THE INVENTION

Field of the Invention

The present invention relates to a printed wiring board, where an outermost conductive-circuit layer is laminated on an inner conductive-circuit layer with an insulation layer provided in between, and connection portions for a component to be mounted on a substrate are formed on the outermost conductive-circuit layer. The present invention also relates to a method for manufacturing such a printed wiring board.

Description of Background Art

In a printed wiring board, an insulation layer may be formed by providing a thermosetting resin sheet on an inner conductive-circuit layer and applying pressure and heat thereon. The outermost conductive-circuit layer is formed on the flat surface by plating or the like (see JP2014-72371A, for example). The entire contents of this publication are incorporated herein by reference.

SUMMARY OF THE INVENTION

According to one aspect of the present invention, a printed wiring board includes an inner conductive-circuit layer, an insulation layer structure including a first insulation layer laminated on inner conductive-circuit layer and a second insulation layer laminated on the first insulation layer, and an outermost conductive-circuit layer laminated on the insulation layer structure and including connection portions such that the connection portions are positioned to mount a component on the insulation layer structure. The second insulation layer is interposed between the first insulation layer and the outermost conductive-circuit layer and has a thickness which is smaller than a thickness of the first insulation layer such that an outer surface of the second insulation layer on an outermost conductive-circuit-layer side is flatter than an inner surface of the second insulation layer on a first insulation-layer side.

According to another aspect of the present invention, a method for manufacturing a printed wiring board includes laminating a first insulation layer on an inner conductive-circuit layer, forming a second insulation layer on the first insulation layer such that the first and second insulation layers form an insulation layer structure including the first insulation layer laminated on inner conductive-circuit layer and the second insulation layer laminated on the first insulation layer, and forming an outermost conductive-circuit layer on the insulation layer structure such that the outermost conductive-circuit layer including connection portions positioned to mount a component on the insulation layer structure. The second insulation layer is interposed between the first insulation layer and the outermost conductive-circuit layer and has a thickness which is smaller than a thickness of the first insulation layer such that an outer surface of the second insulation layer on an outermost conductive-circuit-layer side is flatter than an inner surface of the second insulation layer on a first insulation-layer side.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

In the following, a first embodiment of the present invention is described with reference to FIGS. 1 to 8. Printed wiring board 10 of the present embodiment is structured, for example, to have buildup layers (20, 20) respectively on the upper and lower surfaces of core substrate 11 as shown in the cross-sectional view in FIG. 1. Core substrate 11 is made of an insulative material and conductive-circuit layers (12, 12) (corresponding to an "inner conductive-circuit layer" according to an embodiment of the present invention) formed respectively on the upper and lower surfaces of core substrate 11. Multiple penetrating holes 13 are formed in core substrate 11, and through-hole conductors 14 formed by filling plating in penetrating holes 13 electrically connect portions of upper and lower conductive-circuit layers (12, 12) of core substrate 11 to each other.

On each of upper and lower conductive-circuit layers 12 of core substrate 11, insulation layer 15, outermost conductive-circuit layer 21 and solder-resist layer 22 are laminated in that order so that the aforementioned buildup layer 20 is formed with insulation layer 15 and outermost conductive-circuit layer 21. Insulation layer 15 has a double-layer structure of first insulation layer 16 made of thermosetting insulative resin containing reinforcing material (for example, inorganic filler as a reinforcing material is contained at 30~70 wt. %) and second insulation layer 17 made of thermosetting insulative resin containing no reinforcing material or containing inorganic filler at a lower content than that in first insulation layer 16. First insulation layer 16 is laminated on conductive-circuit layer 12, and second insulation layer 17 is laminated on first insulation layer 16. In addition, distance (L1) (see FIG. 1) is set at 7~30 μm between outermost conductive-circuit layer 21 and conductive-circuit layer 12, and the average thickness of second insulation layer 17 is set at 20~45% of distance (L1) between outermost conductive-circuit layer 21 and conductive-circuit layer 12.

Figure 2:
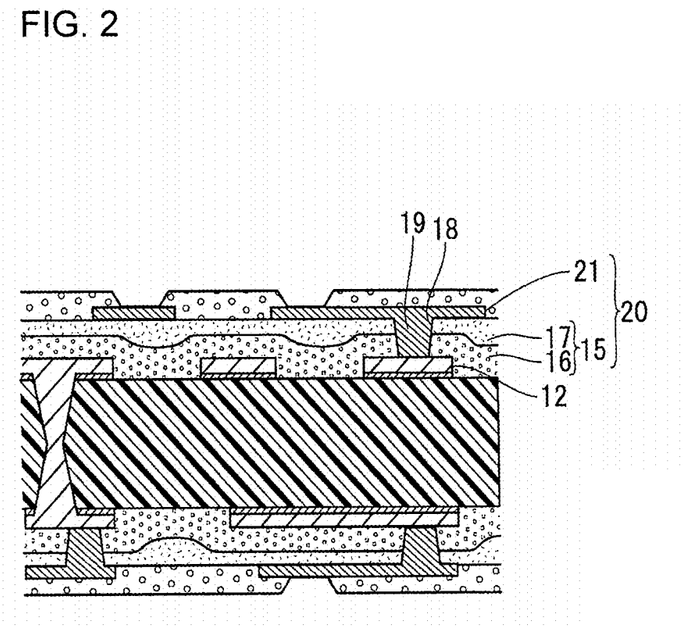
FIG. 2 shows an enlarged view of the region "R" in FIG. 1.

Here, the surface on the conductive-circuit-layer 12 side of first insulation layer 16 shows undulations corresponding to the concavo-convex patterns caused by conductive-circuit layer 12 that protrudes from core substrate 11, whereas the surface of first insulation layer 16 on the opposite side of conductive-circuit layer 12 is substantially flat. However, as the enlarged view in FIG. 2 shows, the surface of first insulation layer 16 on the opposite side of conductive-circuit layer 12 is slightly undulated, being affected by the concavo-convex patterns of conductive-circuit layer 12 (hereinafter referred to as "slight undulations"). On the other hand, the surface of second insulation layer 17 on the first insulation-layer 16 side shows slight undulations corresponding to the shape of first insulation layer 16, while the opposite side is made flat with a higher degree of flatness than that on the first insulation-layer 16 side. In addition, multiple via holes 18 are formed in insulation layer 15, and via conductors 19 made by filling plating in via holes 18 are formed to electrically connect portions of conductive-circuit layer 12 and outermost conductive-circuit layer 21 to each other.

Multiple pad holes are formed in solder-resist layer 22, and multiple pads 23 (corresponding to "connection portions" according to an embodiment of the present invention) are formed in the pad holes by using part of outermost conductive-circuit layer 21. In addition, some of pads 23 are arranged in vertical and horizontal rows on which to mount semiconductor chip 25 (corresponding to a "component to be mounted on a substrate" according to an embodiment of the present invention: see FIG. 8(A)).

Printed wiring board 10 of the present embodiment is manufactured as follows.

Figure 3A:
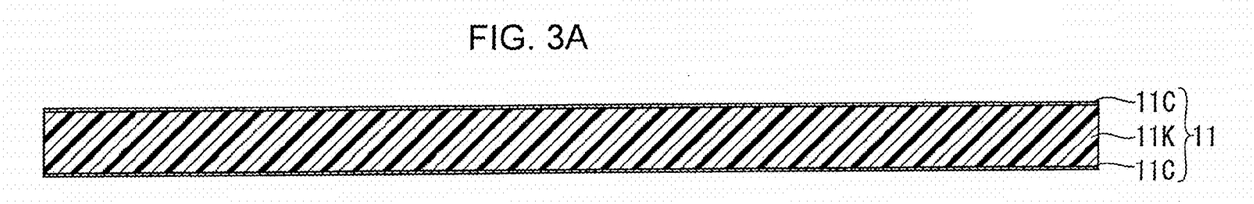
FIG. 3(A)-3(C) show cross-sectional views of steps for manufacturing a printed wiring board.

(1) As shown in FIG. 3(A), core substrate 11 is prepared by laminating copper foil (11C) on both the upper and lower surfaces of insulative base (11K) made of epoxy resin or BT (bismaleimide triazine) resin and reinforcing material such as glass cloth.

Figure 3B:
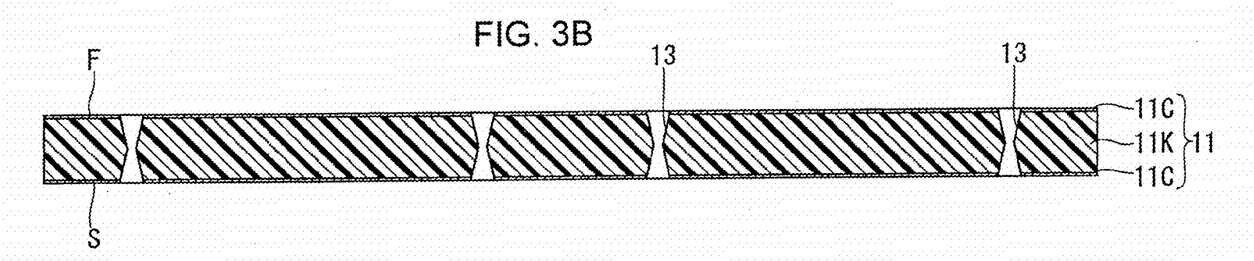

(2) As shown in FIG. 3(B), a $CO_2$ laser is irradiated at core substrate 11 to form multiple penetrating holes 13. More specifically, a $CO_2$ laser is irradiated at either the upper or the lower surface (a so-called surface (F)) of core substrate 11 to form multiple tapered holes that extend to the central portion of core substrate 11 in a thickness direction. Next, a $CO_2$ laser is irradiated at the other surface of core substrate 11 (a so-called surface (S)) at positions directly under the tapered holes on the surface (F) side so that multiple tapered holes the same as those on the surface (F) side are formed. When tapered holes on the surfaces (F) and (S) sides are connected to each other, multiple penetrating holes 13 are formed.

(3) Electroless plating is performed to form electroless plated film (not shown) on copper foil (11C) on each of the upper and lower surfaces of core substrate 11 and on the inner surfaces of penetrating holes 13.

Figure 3C:
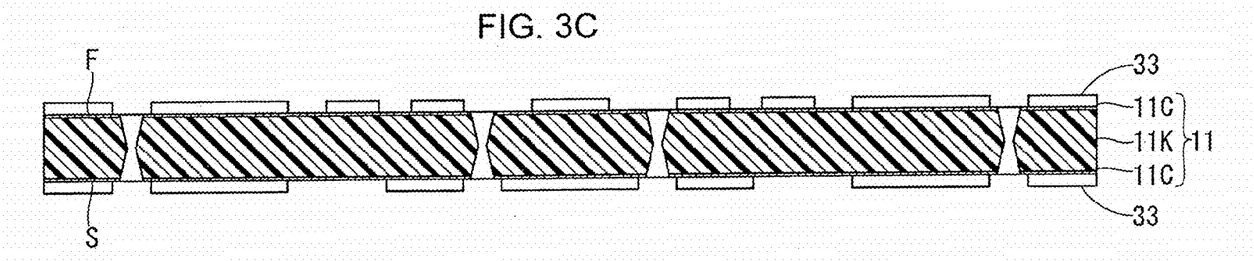

(4) As shown in FIG. 3(C), plating resist 33 with a predetermined pattern is formed on the electroless plated film formed on copper foil (11C).

(5) Electrolytic plating is performed so that electrolytic plated film 34 is formed on portions of the electroless plated film (not shown) exposed from plating resist 33, and plating is filled in penetrating holes 13 to form through-hole conductors 14.

(6) Plating resist 33 is removed, and the electroless plated film (not shown) and copper foil (11C) that were under plating resist 33 are also removed. Conductive-circuit layers (12, 12) on the upper and lower surfaces respectively of core substrate 11 are formed by the remaining electrolytic plated film 34, electroless plated film and copper foil (11C).

Figures 4A, 4B:
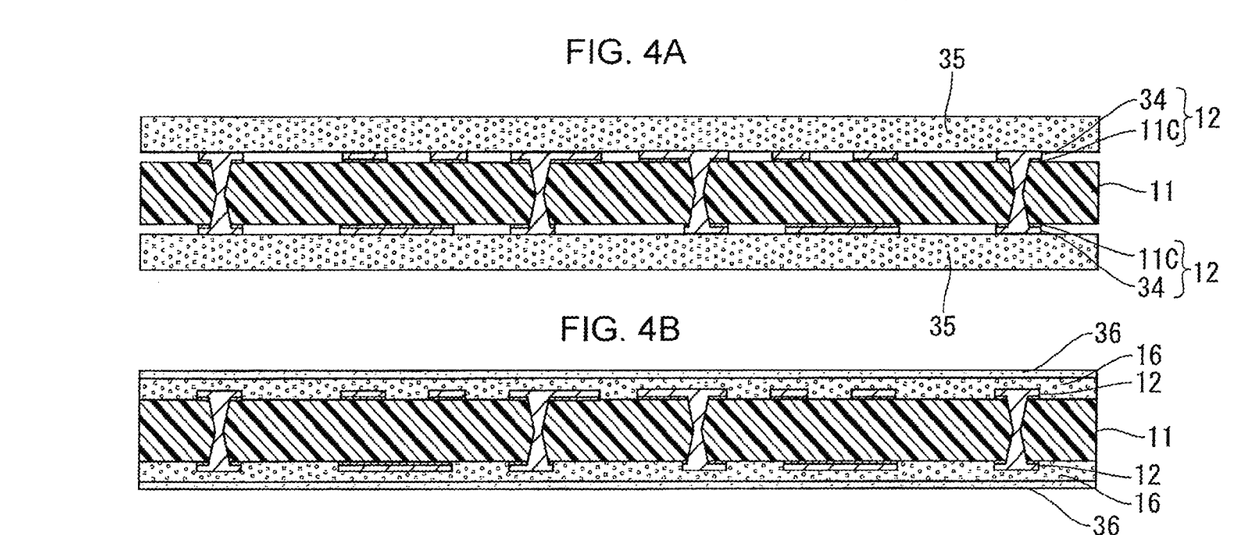
FIG. 4(A)-4(C) show cross-sectional views of steps for manufacturing a printed wiring board.

(7) As shown in FIG. 4(A), resin film 35 is laminated on each conductive-circuit layer 12 on the upper and the lower surfaces of core substrate 11, and heat and pressure are applied thereon. An example of resin film 35 is brand name ABF, made by Ajinomoto Fine-Techno Co., Inc., prepared by adding 30~70 wt. % of inorganic filler as reinforcing material to a thermosetting insulative resin. When resin film 35 is pressed, part of resin film 35 enters gaps between circuits of conductive-circuit layer 12, and the surface of the resin film on the conductive-circuit-layer 12 side is formed to show concavo-convex patterns corresponding to the shape of conductive-circuit layer 12. On the other hand, the surface opposite conductive-circuit layer 12 is made substantially flat when pressed by the flat hot plate of the hot-pressing machine (not shown). Accordingly, resin film 35 is thermoset to make first insulation layer 16. At that time, the surface of first insulation layer 16 on the opposite side of conductive-circuit layer 12 shows slight undulations, where the slightly wavy shape is caused by sink marks derived from the concavo-convex patterns formed on the conductive-circuit-layer 12 side.

(8) As shown in FIG. 4(B), thermosetting insulative resin 36 is coated on each first insulation layer 16 on the upper and lower surfaces of core substrate 11. Thermosetting insulative resin 36 is a so-called liquid adhesive agent with a viscosity of 5~600 Pa·s, and is sprayed, for example, on first insulation layer 16.

(9) After thermosetting insulative resin 36 is coated on first insulation layers (16, 16) on the upper and lower surfaces of core substrate 11, core substrate 11 is positioned between a pair of hot plates of a hot-pressing machine (not shown), and the paired hot plates are pressed against each first insulation layer 16 from above thermosetting insulative resin 36. At that time, the paired hot plates are set at a temperature lower than the curing temperature of thermosetting insulative resin 36. On the first insulation-layer 16 side, thermosetting insulative resin 36 is molded to show slight undulations corresponding to the patterns of first insulation layer 16, whereas on the opposite side, it is molded into a flat surface with a higher degree of flatness than that on the first insulation-layer 16 side. Then, thermosetting insulative resin 36 is set under conditions of a temperature higher than the curing temperature of thermosetting insulative resin 36. As a result, thermosetting insulative resin 36 is cured to make the aforementioned second insulation layer 17. Insulation layers (15, 15) each made up of first insulation layer 16 and second insulation layer 17 are respectively formed on the upper and lower surfaces of core substrate 11.

Figure 4C:
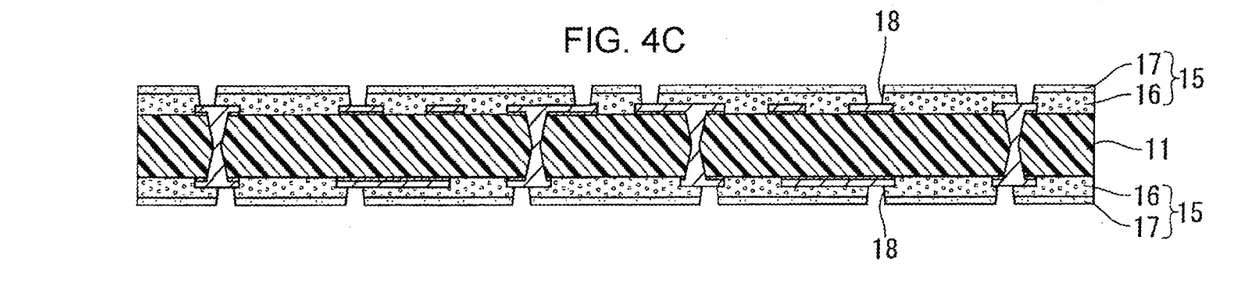

(10) As shown in FIG. 4(C), a $CO_2$ laser is irradiated at each insulation layer 15 on the upper and lower surfaces of core substrate 11 to form multiple via holes 18 penetrating through insulation layer 15.

(11) Electroless plating is performed to form electroless plated film (not shown) on insulation layers 15 and in via holes 18.

Figure 5A:
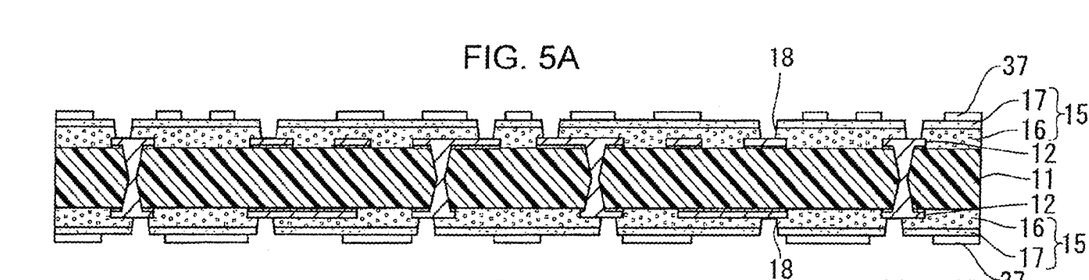
FIG. 5(A)-5(C) show cross-sectional views of steps for manufacturing a printed wiring board.

(12) As shown in FIG. 5(A), plating resist 37 with a predetermined pattern is formed on the electroless plated film formed on insulation layers 15.

Figure 5B:
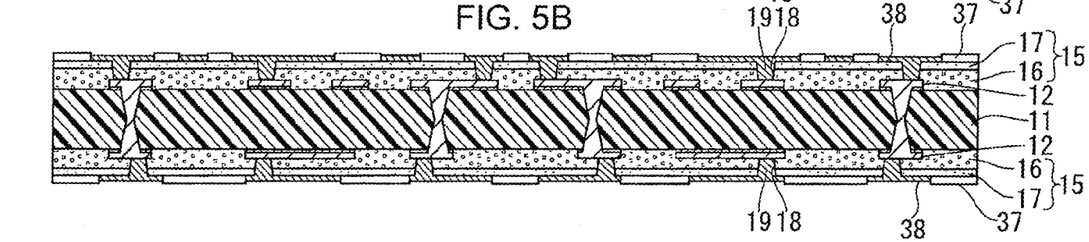

(13) Electrolytic plating is performed and electrolytic plating is filled in via holes 18 to form via conductors 19, while electrolytic plated films (38, 38) are formed on portions of the electroless plated film (not shown) formed on insulation layer 15 and exposed from plating resist 37, as shown in FIG. 5(B).

Figure 5C:
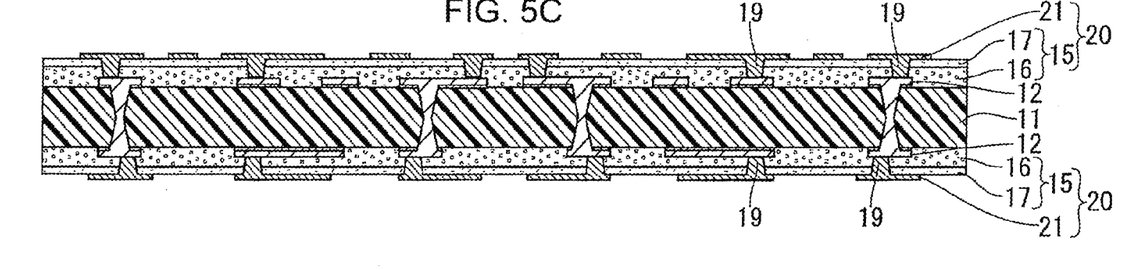

(14) Plating resist 37 is removed and the electroless plated film (not shown) that was under plating resist 37 is also removed. As shown in FIG. 5(C), outermost conductive-circuit layer 21 is formed on each insulation layer 15 by the remaining electrolytic plated film 38 and electroless plated film. Portions of outermost conductive-circuit layer 21 and conductive-circuit layer 12 are connected to each other by via conductors 19.

Figure 6A:
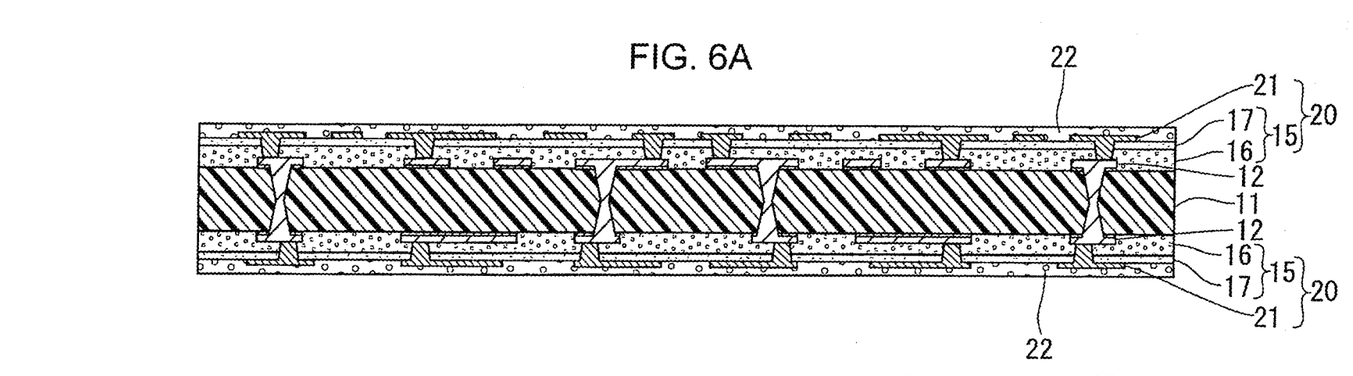
FIG. 6(A)-6(B) show cross-sectional views of steps for manufacturing a printed wiring board.

(15) As shown in FIG. 6(A), solder-resist layers (22, 22) are respectively laminated on outermost conductive-circuit layers (21, 21) positioned on the upper and lower surfaces of core substrate 11.

Figure 6B:
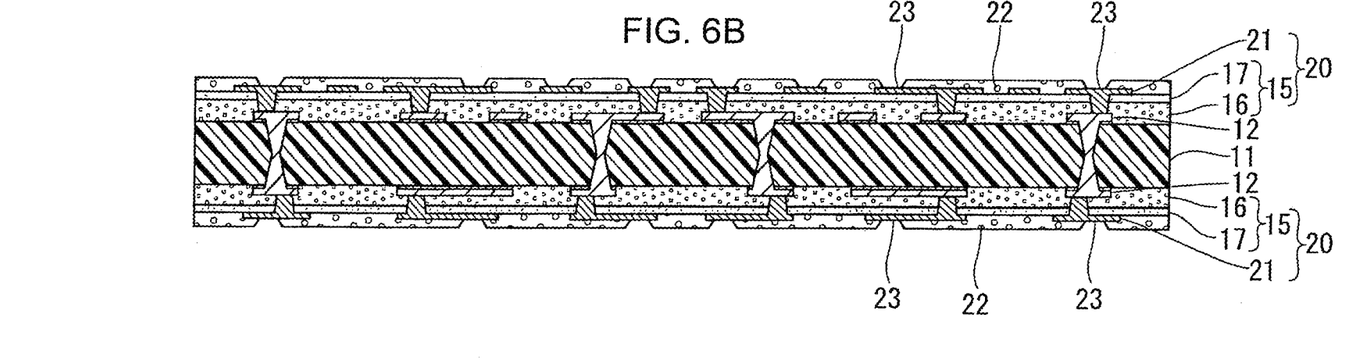

(16) As shown in FIG. 6(B), tapered pad holes are formed in predetermined portions of solder-resist layers (22, 22) to make the aforementioned pads 23 by exposing portions of outermost conductive-circuit layers (21, 21) from solder-resist layers (22, 22).

Figure 1:
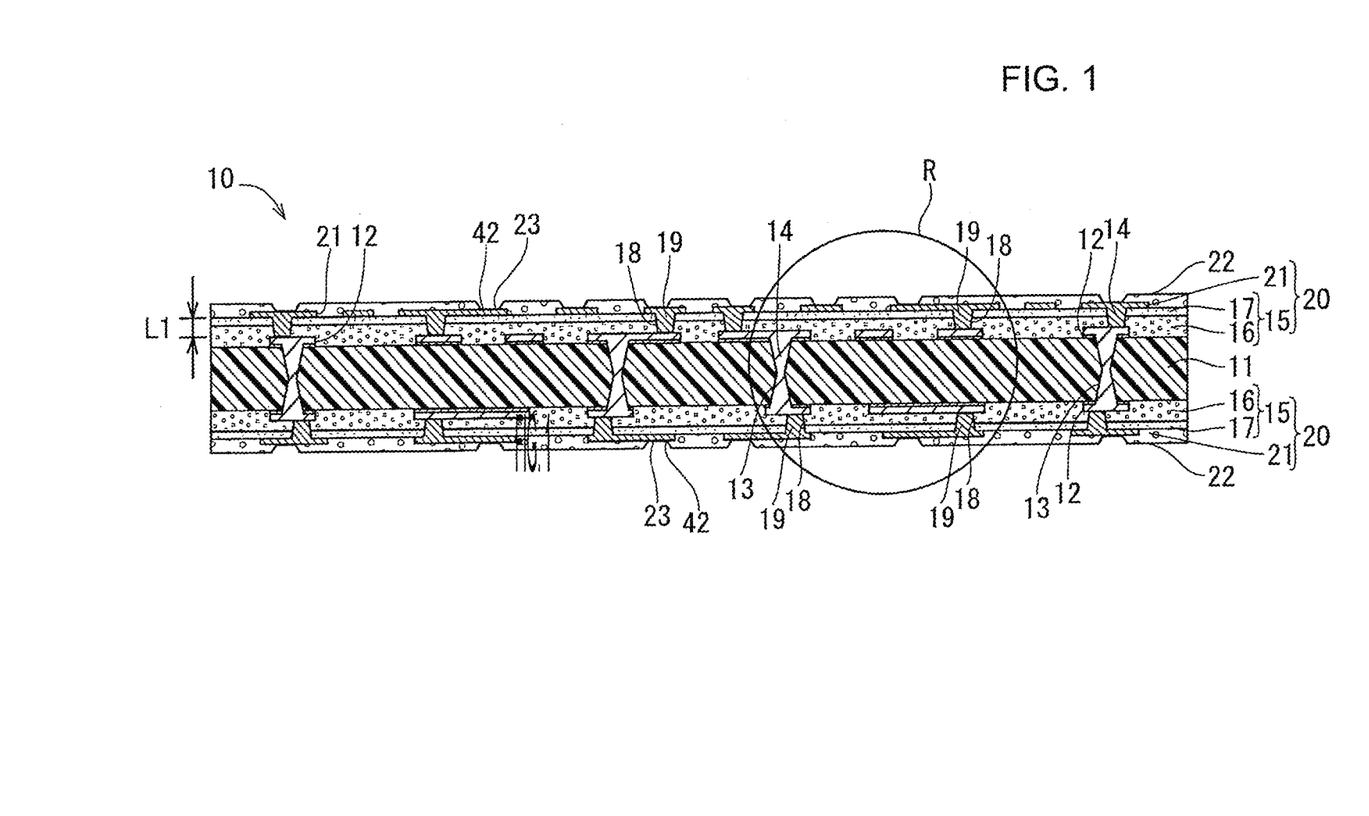
FIG. 1 shows a cross-sectional view of a printed wiring board according to a first embodiment of the present invention.

(17) As shown in FIG. 1, metal film 42 is formed by laminating a nickel layer and a gold layer in that order on pads 23. Printed wiring board 10 is completed.

Figure 7:
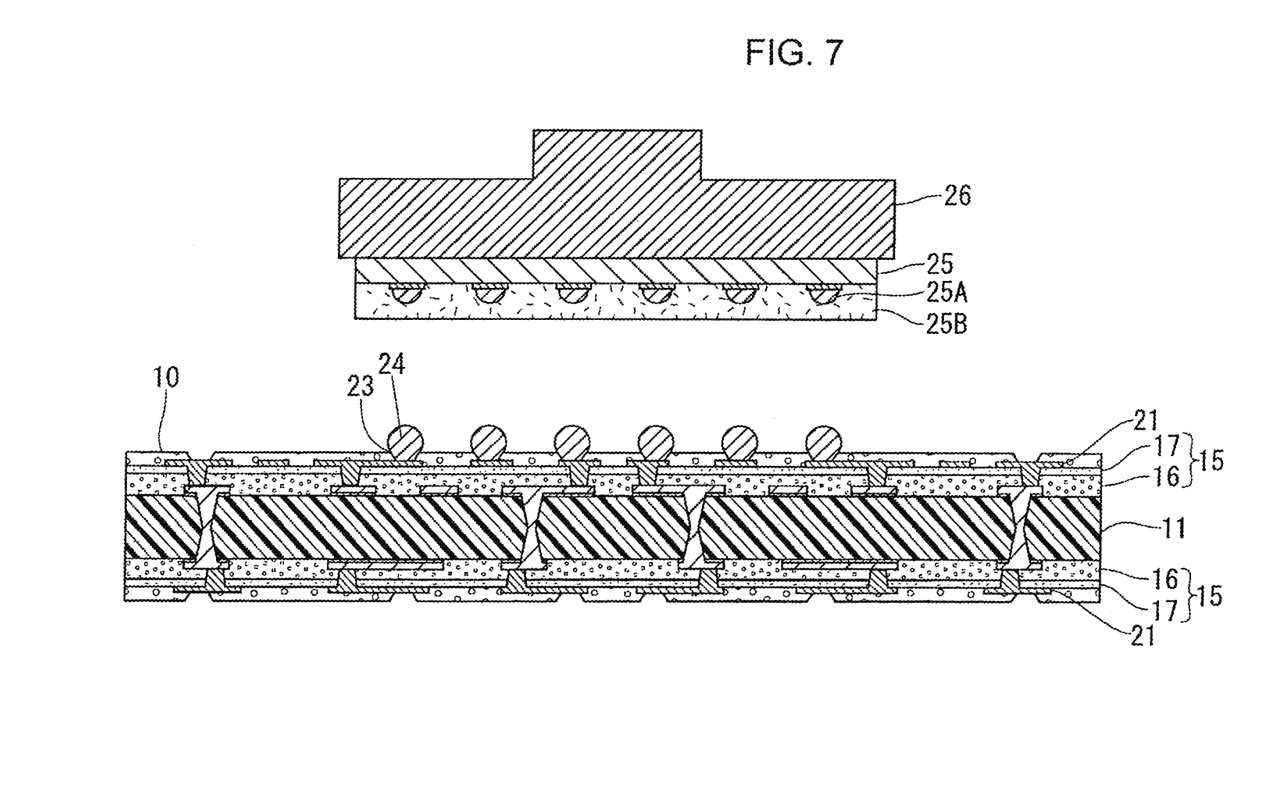
FIG. 7 shows a view schematically illustrating a usage example of a printed wiring board.

So far, the structure and manufacturing method of printed wiring board 10 have been described according to the first embodiment. Next, effects of printed wiring board 10 are described with reference to usage examples of printed wiring board 10. Printed wiring board 10 of the present embodiment is used in the following example. Namely, as shown in FIG. 7, multiple solder bumps 24 are formed on multiple pads 23 of printed wiring board 10. Then, using thermal compression bonding (TCB), a component, for example, a semiconductor chip 25, is mounted on the wiring board. More specifically, semiconductor chip 25 is prepared to have non-conductive film (NCF) (25B) laminated in advance on connection portions (25A) provided on its lower surface. After plasma is irradiated on the group of solder bumps 24, printed wiring board 10 is heated to 100° C. Then, TCB head 26 heated to 300° C., for example, is applied on the upper surface of semiconductor chip 25 in such a way to hold semiconductor chip 25, while connection portions (25A) of semiconductor chip 25 are heated to a temperature higher than the softening point of solder bumps 24 and NCF (25B) (for example, 240±5° C.). Then, TCB head 26 is lowered, as it maintains the position described above, so that connection portions (25A) of semiconductor chip 25 are pressed against solder bumps 24 of printed wiring board 10. Accordingly, solder bumps 24 are softened and semiconductor chip 25 is soldered to printed wiring board 10.

Figure 8A:
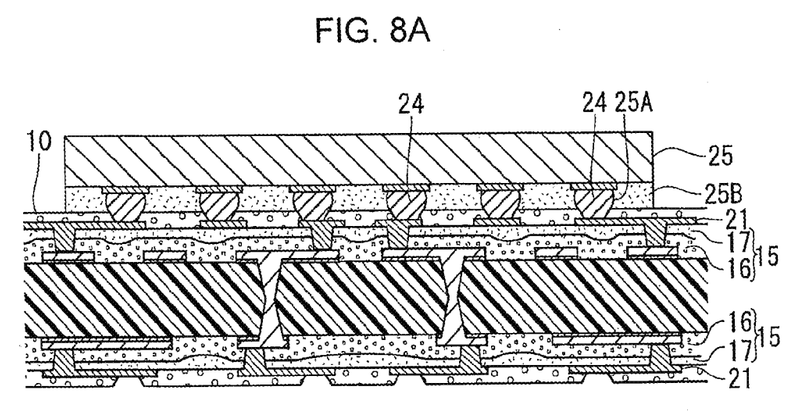
FIG. 8(A) shows a cross-sectional view of a printed wiring board with a mounted semiconductor chip.
Figure 8B:
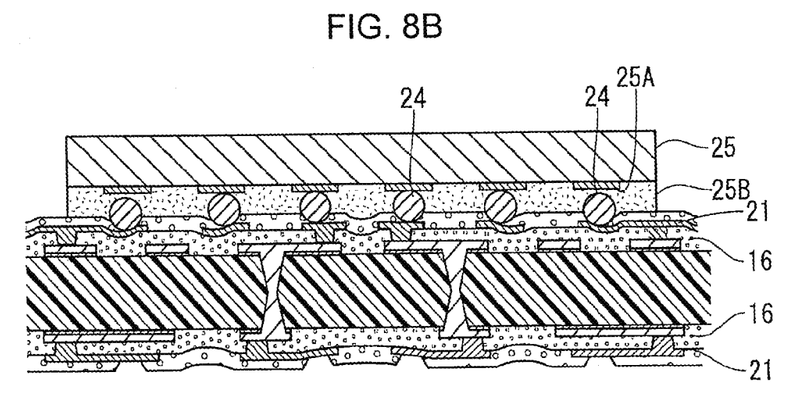
FIG. 8(B) shows a cross-sectional view of a printed wiring board with a mounted semiconductor chip where connection failure is observed.

At that time, if the degree of flatness of insulation layer 15 is low in printed wiring board 10, some of multiple solder bumps 24 may fail to be connected to semiconductor chip 25 as shown in FIG. 8(B). However, in printed wiring board 10 of the present embodiment, second insulation layer 17 thinner than first insulation layer 16 is laminated on the outermost conductive-circuit-layer 21 side of first insulation layer 16 positioned under outermost conductive-circuit layer 21. Accordingly, gaps between slight undulations on first insulation layer 16 are filled by second insulation layer 17, and the surface of second insulation layer 17 on the outermost conductive-circuit-layer 21 side is made flatter than the surface on the first insulation-layer 16 side. As a result, the surface on the outermost conductive-circuit-layer 21 side of insulation layer 15, which is made up of first insulation layer 16 and second insulation layer 17, exhibits a higher degree of flatness than that in conventional wiring boards. In addition, because of its low viscosity, thin second insulation layer 17 flows well when it cures, thus it is unlikely to show sink marks, thereby making it easier to form a flat second insulation layer 17 on the outermost conductive-circuit-layer 21 side.

Second Embodiment

Figure 9:
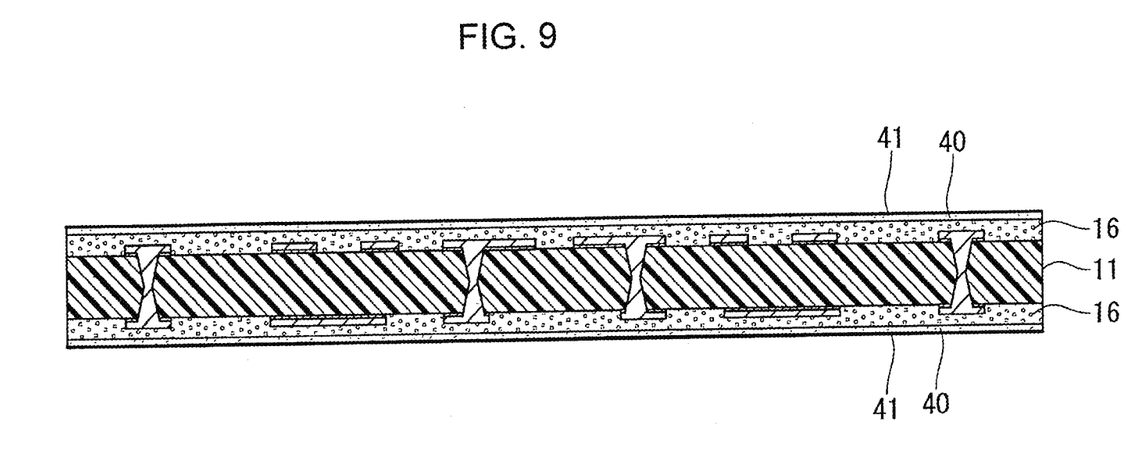
FIG. 9 shows a cross-sectional view of a step for manufacturing a printed wiring board according to a second embodiment.

In a second embodiment, a step for forming second insulation layer 17 in the manufacturing method of printed wiring board 10 is different from that in the first embodiment. Namely, the method for manufacturing printed wiring board 10 of the present embodiment uses thermosetting insulative resin film 40 with release sheet 41 laminated on one of its surfaces as shown in FIG. 9. On each of the upper and lower surfaces of core substrate 11, thermosetting insulative resin film 40 is laminated on first insulation layer 16 in such a way that the side without release sheet 41 faces first insulation layer 16. Then, core substrate 11 is positioned between a pair of hot plates of a hot-pressing machine, and the paired hot plates are pressed against each first insulation layer 16 from above release sheet 41. Accordingly, thermosetting insulative resin film 40 on the first insulation-layer 16 side is molded to show slight undulations corresponding to first insulation layer 16, while its opposite side is molded into a flat surface with a higher degree of flatness than that on the first insulation-layer 16 side. Accordingly, the aforementioned second insulation layer 17 is formed. After that, release sheet 41 is removed from second insulation layer 17, and outermost conductive-circuit layer 21, solder-resist layer 22 and the like are formed the same as in the first embodiment to complete printed wiring board 10. Using the manufacturing method of the present embodiment, forming second insulation layer 17 is simplified and scattering of thermosetting insulative resin is avoided when second insulation layer 17 is formed.

Third Embodiment

Figure 10:
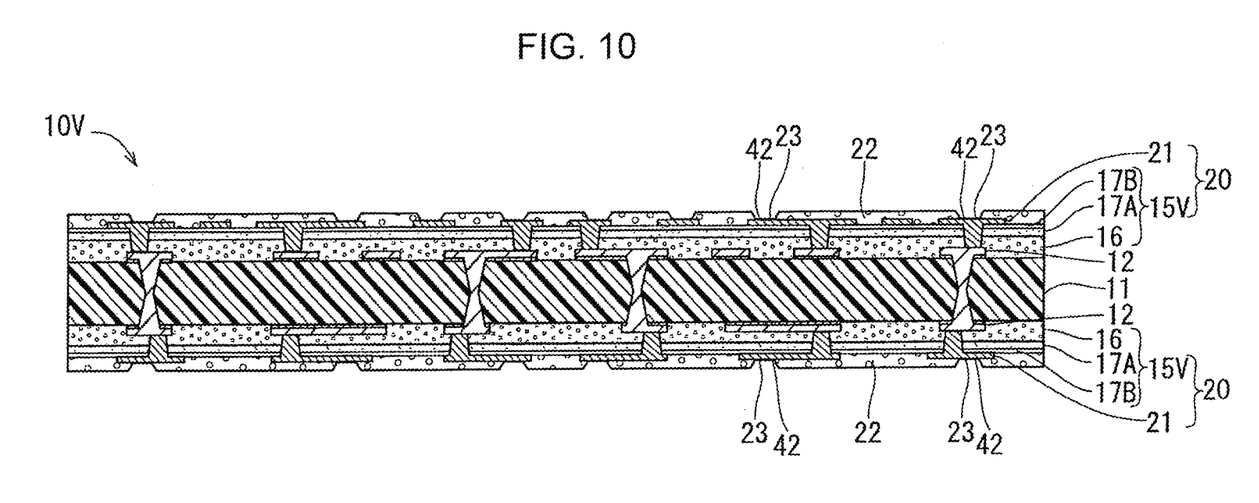
FIG. 10 shows a cross-sectional view of a printed wiring board according to a third embodiment.

Printed wiring board (10V) of the present embodiment is different from those in first and second embodiments in that multiple (for example, two) second insulation layers (17A, 17B) are laminated on each first insulation layer 16 on the upper and lower surfaces of core substrate 11 as shown in FIG. 10. Insulation layer (15V) is formed with first insulation layer 16 and multiple second insulation layers (17A, 17B). More specifically, second insulation layer (17A) formed on the first insulation-layer 16 side is set to have a thickness 1~3 times, for example, as thick as second insulation layer (17B) formed on the outermost conductive-circuit-layer 21 side. In addition, second insulation layer (17A) and the other second insulation layer (17B) are made of a thermosetting insulative resin that does not contain reinforcing material or contains less inorganic filler than first insulation layer 16.

Printed wiring board (10V) of the present embodiment is manufactured as follows: After first insulation layers (16, 16) are formed on the upper and lower surfaces of core substrate 11, using the same method for forming second insulation layer 17 as in the first embodiment, liquid-type thermosetting resin (36A) is sprayed on first insulation layers (16, 16), and core substrate 11 is hot pressed from both the upper-and-lower-surface sides so that second insulation layer (17A) is formed on each first insulation layer 16. Next, by repeating the same procedure as above, liquid-type thermosetting resin (36B) is sprayed on each second insulation layer (17A), and core substrate 11 is hot pressed so that second insulation layer (17B) is formed on each second insulation layer (17A). Accordingly, insulation layers (15V) are completed, each made up of first insulation layer 16 and second insulation layers (17A, 17B). Using the same procedure as in the first embodiment for the rest, outermost conductive-circuit layer 21, solder-resist layers 22 and the like are formed to complete printed wiring board (10V). According to the structure of the present embodiment, the surface of insulation layer (15V) on the outermost conductive-circuit-layer 21 side is made to have an even higher degree of flatness. In the present embodiment, it is also an option for second insulation layers (17A, 17B) to be formed by using thermosetting insulative resin film 40 with release sheet 41 laminated on one of its surfaces, the same as in the second embodiment.

Other Embodiments

The present invention is not limited to the embodiments above. For example, other embodiments described below may also be included in the technological scope of the present invention. Moreover, various modifications are possible in the embodiments unless they deviate from the gist of the present invention.

(1) In the first through third embodiments above, hot plates were used to form a flat surface on one side of each of first insulation layer 16 and second insulation layers (17, 17A, 17B). However, first insulation layer 16 and the like may also be pressure-molded by passing core substrate 11 through a pair of rollers.

Figure 11:
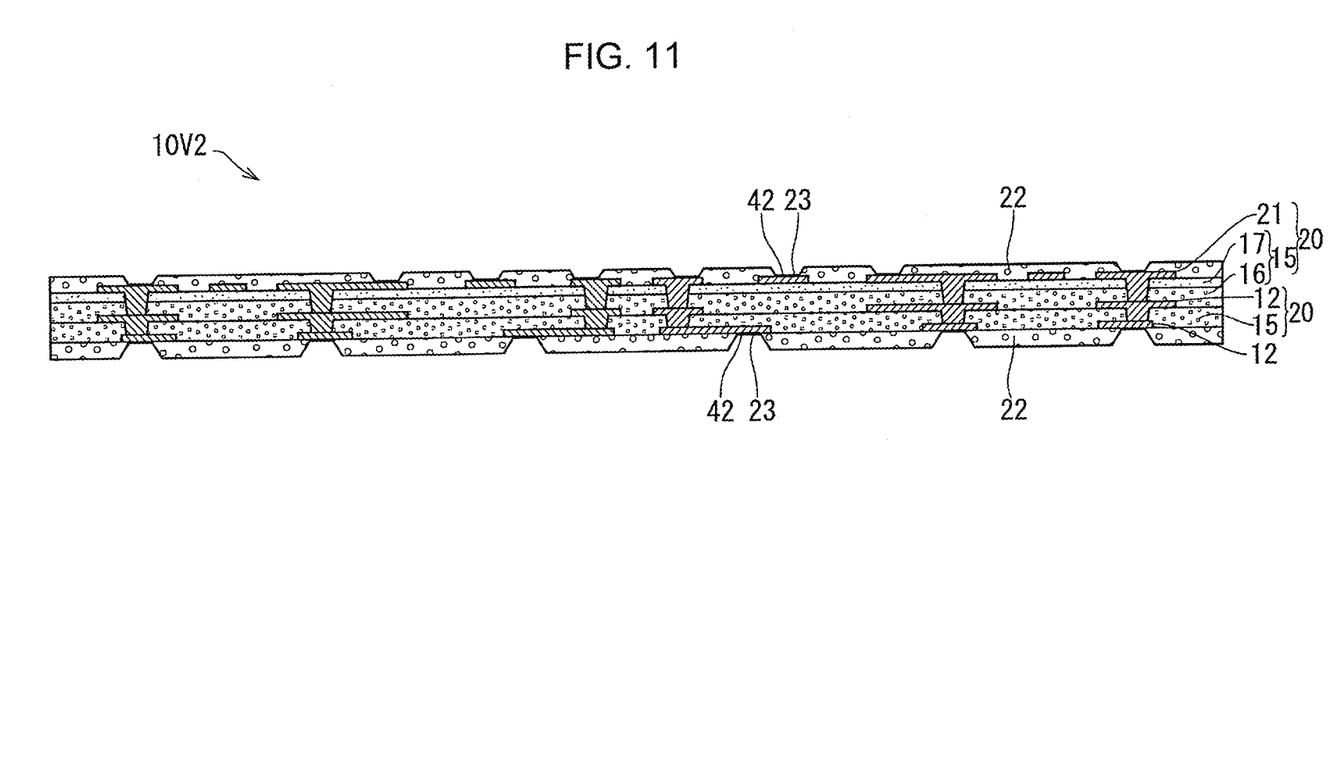
FIG. 11 shows a cross-sectional view of a printed wiring board according to another embodiment.

(2) Printed wiring boards 10 and (10V) in the first to third embodiments above included core substrate 11. However, the present invention may also be applied on printed wiring board (10V2) that does not include a core substrate as shown in FIG. 11.

(3) In the first embodiment above, thermosetting insulative resin 36 for forming second insulation layer 17 was pressed using hot plates heated at a temperature lower than the resin curing temperature, and then the temperature was raised to be higher than the curing temperature. However, a second insulation layer may be formed by pressing a thermosetting insulative resin by using hot plates that are heated to a temperature higher than the curing temperature of the thermosetting insulative resin.

(4) In printed wiring boards (10, 10V) of the first through third embodiments above, single buildup layers (20, 20) are respectively formed on both surfaces of core substrate 11. However, multiple buildup layers may be laminated.

In a printed wiring board, an insulation layer may be formed by providing a thermosetting resin sheet on an inner conductive-circuit layer and applying pressure and heat thereon. On the side where the inner conductive-circuit layer is formed, the surface of the laminated insulation layer shows undulations corresponding to the concavo-convex patterns of the inner conductive-circuit layer, whereas the surface of the insulation layer opposite the inner conductive-circuit layer is made flat as a result of being pressed by the flat hot plate of a hot pressing machine.

The surface of the insulation layer on which the outermost conductive-circuit layer is laminated is not made sufficiently flat due to the concavo-convex patterns of the inner conductive-circuit layer. Thus, when multiple solder bumps, for example, are arranged in vertical and horizontal rows on the outermost conductive-circuit layer and a component to be mounted on the substrate is connected to those solder bumps, connection failure may be observed in some solder bumps.

A printed wiring board according to an embodiment of the present invention has an insulation layer which exhibits enhanced surface flatness, and an outermost conductive-circuit layer laminated on the insulation layer. Another embodiment of the present invention is a method for manufacturing such a printed wiring board.

A printed wiring board according to an embodiment of the present invention has a first insulation layer; an outermost conductive-circuit layer which is laminated on the first insulation layer and has connection portions for a component to be mounted on the substrate; an inner conductive-circuit layer laminated under the first insulation layer; and a second insulation layer sandwiched between the first insulation layer and the outermost conductive-circuit layer and formed to be thinner than the first insulation layer. In such a printed wiring board, the second insulation layer is set to have a flatter surface on the outermost conductive-circuit-layer side than on the first insulation-layer side.

In a printed wiring board according to an embodiment of the present invention, concavo-convex patterns of a first insulation layer underneath the outermost conductive-circuit layer are filled with a second insulation layer by laminating the second insulation layer, which is thinner than the first insulation layer and is positioned on the outermost conductive-circuit-layer side of the first insulation layer, so that the second insulation layer is set to have a flatter surface on the outermost conductive-circuit-layer side than on the first insulation-layer side. Accordingly, among the surfaces of the insulation layer made up of the first and second insulation layers, the surface on the outermost conductive-circuit-layer side is made flatter than that in a conventional printed wiring board.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
an inner conductive-circuit layer;
an insulation layer structure comprising a first insulation layer laminated on the inner conductive-circuit layer and a second insulation layer laminated on the first insulation layer; and
an outermost conductive-circuit layer laminated on the insulation layer structure and comprising a plurality of connection portions such that the plurality of connection portions is positioned to mount a component on the insulation layer structure,
wherein the second insulation layer is interposed between the first insulation layer and the outermost conductive-circuit layer and has a thickness which is smaller than a thickness of the first insulation layer such that an outer surface of the second insulation layer on an outermost conductive-circuit-layer side is flatter than an inner surface of the second insulation layer on a first insulation-layer side.

2. A printed wiring board according to claim 1, wherein the second insulation layer in the insulation layer structure comprises thermosetting resin which does not contain reinforcing material or contains inorganic filler in an amount less than the first insulation layer.

3. A printed wiring board according to claim 2, wherein the first insulation layer of the insulation layer structure comprises reinforcing material.

4. A printed wiring board according to claim 2, wherein the first insulation layer of the insulation layer structure comprises inorganic filler in an amount of 30 wt. % to 70 wt. %.

5. A printed wiring board according to claim 2, wherein the second insulation layer of the insulation layer structure has an average thickness in a range of 20% to 45% of a distance between the outermost conductive-circuit layer and the inner conductive-circuit layer.

6. A printed wiring board according to claim 5, wherein the distance between the outermost conductive-circuit layer and the inner conductive-circuit layer is in a range of 7 μm to 30 μm.

7. A printed wiring board according to claim 2, wherein the second insulation layer of the insulation layer structure comprises a plurality of insulation layers.

8. A printed wiring board according to claim 1, wherein the first insulation layer of the insulation layer structure comprises inorganic filler in an amount of 30 wt. % to 70 wt %.

9. A printed wiring board according to claim 1, wherein the second insulation layer of the insulation layer structure has an average thickness in a range of 20% to 45% of a distance between the outermost conductive-circuit layer and the inner conductive-circuit layer.

10. A printed wiring board according to claim 9, wherein the distance between the outermost conductive-circuit layer and the inner conductive-circuit layer is in a range of 7 μm to 30 μm.

11. A printed wiring board according to claim 1, wherein the second insulation layer of the insulation layer structure comprises a plurality of insulation layers.

12. A printed wiring board according to claim 1, further comprising:
a core substrate having a first surface and a second surface on an opposite side with respect to the first surface,
wherein a plurality of buildup layers each comprising the inner conductive-circuit layer, the insulation layer structure and the outermost conductive-circuit layer is formed on the first and second surfaces of the core substrate, respectively.

13. A printed wiring board according to claim 1, further comprising:
a solder resist layer formed on the outermost conductive-circuit layer such that the solder resist layer has a plurality of opening portions exposing the plurality of connection portions, respectively.

14. A printed wiring board according to claim 1, wherein the second insulation layer is interposed between the first insulation layer and the outermost conductive-circuit layer such that the outer surface of the second insulation layer is flatter than an outer surface of the first insulation layer on the outermost conductive-circuit-layer side.

15. A method for manufacturing a printed wiring board, comprising:

laminating a first insulation layer on an inner conductive-circuit layer;
forming a second insulation layer on the first insulation layer such that the first and second insulation layers form an insulation layer structure comprising the first insulation layer laminated on the inner conductive-circuit layer and the second insulation layer laminated on the first insulation layer; and
forming an outermost conductive-circuit layer on the insulation layer structure such that the outermost conductive-circuit layer comprises a plurality of connection portions positioned to mount a component on the insulation layer structure,
wherein the second insulation layer is interposed between the first insulation layer and the outermost conductive-circuit layer and has a thickness which is smaller than a thickness of the first insulation layer such that an outer surface of the second insulation layer on an outermost conductive-circuit-layer side is flatter than an inner surface of the second insulation layer on a first insulation-layer side.

16. A method for manufacturing a printed wiring board according to claim 15, wherein the first insulation layer of the insulation layer structure comprises reinforcing material, the forming of the second insulation layer comprises coating thermosetting resin over the first insulation layer or laminating a thermosetting resin film over the first insulation layer, and applying a heated plate or roller upon the second insulation layer such that the second insulation layer undergoes pressure-molding to flatten the outer surface of the second insulation layer.

17. A method for manufacturing a printed wiring board according to claim 16, wherein the applying of the heated plate or roller upon the second insulation layer comprises pressing the heated plate or roller to the second insulation layer at a temperature which is lower than a curing temperature of the second insulation layer such that the second insulation layer undergoes pressure-molding to flatten the outer surface of the second insulation layer, and heating the heated plate or roller to a temperature which is higher than the curing temperature of the second insulation layer such that the second insulation layer is cured.

18. A method for manufacturing a printed wiring board according to claim 15, wherein the inner conductive-circuit layer and the insulation layer structure are formed on first and second surfaces of a core substrate respectively, and the forming of the second insulation layer comprises applying heated plates or rollers upon the second insulation layers on the first and second surfaces of the core substrate such that the second insulation layers undergo pressure-molding to flatten the outer surface of the second insulation layer.

19. A method for manufacturing a printed wiring board according to claim 15, wherein the forming of the second insulation layer comprises coating thermosetting resin having viscosity in a range of 5 Pa·s to 600 Pa·s over the first insulation layer.

20. A method for manufacturing a printed wiring board according to claim 15, wherein the forming of the second insulation layer comprises laminating a thermosetting resin film having a release sheet over the first insulation layer such that the release sheet is positioned on an opposite side with respect to the first insulation layer, applying a heated plate upon the release sheet of the thermosetting resin film such that the thermosetting resin film undergoes pressure-molding to flatten the outer surface of the second insulation layer, and removing the release sheet from the second insulation layer.

* * * * *